US012701931B2

(12) United States Patent
Marozas et al.

(10) Patent No.: US 12,701,931 B2
(45) Date of Patent: Aug. 4, 2026

(54) METHOD OF SELECTIVELY FORMING PHOSPHOROUS-DOPED EPITAXIAL MATERIAL ON A SURFACE

(71) Applicant: ASM IP Holding, B.V., Almere (NL)

(72) Inventors: Brendan Timothy Padraig Marozas, Leuven (BE); Rami Khazaka, Leuven (BE)

(73) Assignee: ASM IP Holding B.V., Almere (NL)

( * ) Notice: Subject to any disclaimer, the term of this patent is extended or adjusted under 35 U.S.C. 154(b) by 189 days.

(21) Appl. No.: 18/307,489

(22) Filed: Apr. 26, 2023

(65) Prior Publication Data

US 2024/0096619 A1      Mar. 21, 2024

Related U.S. Application Data

(60) Provisional application No. 63/335,838, filed on Apr. 28, 2022.

(51) Int. Cl.
　　*H10P 14/24*　　　(2026.01)
　　*H10P 14/20*　　　(2026.01)
　　*H10P 50/24*　　　(2026.01)

(52) U.S. Cl.
　　CPC .......... *H10P 14/3444* (2026.01); *H10P 14/24* (2026.01); *H10P 14/27* (2026.01);
　　　　　　　　(Continued)

(58) Field of Classification Search
　　CPC ......... H01L 21/02579; H01L 21/02381; H01L 21/02433; H01L 21/0262; H01L 21/02636; H01L 21/3065; H01L 21/0245; H01L 21/0243; H01L 21/02532; H01L 21/02576; H01L 21/02639; H01L 21/0257; H10P 14/3444; H10P 14/24; H10P 14/27; H10P 14/2905; H10P 14/2926; H10P 50/242; H10P 14/271; H10P 14/3211;
(Continued)

(56) References Cited

U.S. PATENT DOCUMENTS 4,681,657 A * 7/1987 Hwang ............... H01L 21/3085
　　　　　　　　　　　　　　　　　　252/79.3
6,391,749 B1 5/2002 Park
(Continued)

FOREIGN PATENT DOCUMENTS

KR　　　20090030226 A * 3/2009 .......... H10P 14/3411

OTHER PUBLICATIONS

Selective epitaxial growth (SEG) of highly doped Si:P on Source/ Drain areas of NMOS devices using Si3H8/PH3/CI-2 chemistry. M. Bauer, S.G. Thomas. ECS Transactions, 33 (6) 629-636 (2010) 10.1149/1.3487593 © The Electrochemical Society (Year: 2010).*
(Continued)

*Primary Examiner* — Marlon T Fletcher
*Assistant Examiner* — Da Wei Lee
(74) *Attorney, Agent, or Firm* — Banner & Witcoff, Ltd.

(57) ABSTRACT

Methods and systems for selectively forming phosphorus-doped epitaxial material. The methods can be used to selectively form the phosphorus-doped epitaxial material within a gap from the bottom upward. Exemplary methods can be used to, for example, form source and/or drain regions in field effect transistor devices, such as in gate-all-around field effect transistor devices.

20 Claims, 7 Drawing Sheets

(52) U.S. Cl.
CPC ...... *H10P 14/2905* (2026.01); *H10P 14/2926*
(2026.01); *H10P 50/242* (2026.01)

(58) Field of Classification Search
CPC .............. H10P 14/3411; H10P 14/2925; H10P
14/3438; H10P 14/38; H10P 50/642;
H10P 14/3458; H10D 30/024; H10D
30/021; H10D 62/151; H10D 30/6735
See application file for complete search history.

(56) References Cited

U.S. PATENT DOCUMENTS

| | | | |
|---|---|---|---|
| 2011/0117732 A1* | 5/2011 | Bauer | ................... H10D 62/151 |
| | | | 438/507 |
| 2012/0295427 A1* | 11/2012 | Bauer | ................ H10P 14/3442 |
| | | | 438/494 |
| 2021/0151315 A1 | 5/2021 | Pierreux | |
| 2021/0254238 A1 | 8/2021 | Khazaka | |
| 2023/0307506 A1* | 9/2023 | Breil | ...................... H10D 64/01 |

OTHER PUBLICATIONS

Selective epitaxial growth (SEG) of highly doped Si:P on Source/
Drain areas of NMOS devices using Si3H8/PH3/CI-2 chemistry. M.
Bauer, S.G. Thomas. ECS Transactions, 33 (6) 629-636 (2010)
10.1149/1.3487593 © The Electrochemical Society.

* cited by examiner

METHOD OF SELECTIVELY FORMING PHOSPHOROUS-DOPED EPITAXIAL MATERIAL ON A SURFACE

FIELD OF THE INVENTION

The present disclosure generally relates to methods and systems suitable for forming electronic devices. More particularly, the disclosure relates to methods and systems that can be used for selectively depositing phosphorous-doped epitaxial material on a surface of a substrate.

BACKGROUND OF THE DISCLOSURE

The scaling of semiconductor devices, such as, for example, complementary metal-oxide-semiconductor (CMOS) devices, has led to significant improvements in speed and density of integrated circuits. Recently, for example, multi-gate and three-dimensional field effect transistors (FETs), such as FinFETS and gate-all-around FETs have been developed to further scale semiconductor devices. However, device scaling for such devices faces significant challenges.

One particular challenge relates to the manufacture of defect-free active regions, such as source and drain regions of three-dimensional structures suitable for FinFETs, gate-all-around FETs, and the like. In such applications, it may be desirable to selectively form relatively high conductivity semiconductor material (e.g., doped crystalline Group IV or other semiconductor material). In particular, it may be desirable to selectively epitaxially grow monocrystalline doped semiconductor material on a surface for such applications. However, such techniques may not be well developed. Accordingly, improved methods and systems for selectively and epitaxially forming doped semiconductor material are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to deposition methods, and more particularly, to selective epitaxial deposition methods. Embodiments of the disclosure also relate to structures and devices formed using such methods, and to apparatus for performing the methods and/or for forming the structure and/or devices. While the ways in which various embodiments of the present disclosure address drawbacks of prior methods and systems are discussed in more detail below, in general, various embodiments of the disclosure provide improved methods of selectively and epitaxially forming doped semiconductor layers on a first surface relative to a second surface. The doped semiconductor layers may be suitable as source and/or drain regions in field effect transistors such as FinFETs and gate-all-around metal oxide semiconductor field effect transistors.

In accordance with at least one embodiment of the disclosure, a method of selectively forming P-doped monocrystalline material on a surface of a substrate is provided. An exemplary method includes providing a substrate within a reaction chamber and performing a cyclical deposition process to selectively form P-doped epitaxial material overlying a first surface of the substrate, relative to a second surface of the substrate. The first surface can include a first crystallographic orientation and the second surface can include a second crystallographic orientation, which is different from the first crystallographic orientation. The first surface and the second surface can be or include the same material. The cyclical deposition process can include one or more deposition cycles. Each deposition cycle can include forming P-doped epitaxial material overlying the first surface and forming P-doped epitaxial or non-epitaxial material overlying the second surface, forming intrinsic epitaxial material overlying the P-doped epitaxial material and forming intrinsic epitaxial or non-epitaxial material overlying the P-doped epitaxial or non-epitaxial material, and selectively etching the intrinsic epitaxial or non-epitaxial material and the P-doped epitaxial or non-epitaxial material overlying the second surface, relative to the intrinsic epitaxial material and the P-doped epitaxial material overlying the first surface. In accordance with examples of these embodiments, first surface comprises or consists of a Si$\{100\}$ crystal facet. In accordance with further examples, the second surface comprises one or more of a Si$\{110\}$ crystal facet and a higher order silicon crystal facet that is perpendicularly oriented to a Si$\{100\}$ crystal facet. In accordance with additional examples, the substrate comprises a feature. The feature can include a bottom comprising the first surface and a sidewall surface comprising the second surface. In accordance with yet further examples, a temperature within the reaction chamber during one or more steps is less than 450° C. or between about 400° C. and about 500° C. or between about 440° C. and about 480° C. or between about 440° C. and about 460° C. In accordance with further examples, the step of selectively etching (e.g., the intrinsic non-epitaxial material and the P-doped non-epitaxial material) comprises providing an etchant. This step can further include providing a carrier gas. In such cases, a flowrate of the carrier gas and a flowrate of the etchant is between about 50 and about 200 or between about 30 and about 1300 or between about 25 and about 1500 or between about 75 and 500. The P-doped epitaxial or non-epitaxial material overlying the second surface can be removed during each process cycle. As set forth in more detail below, methods as described herein can be used to fill a feature, such as a gap, with monocrystalline epitaxial material from the bottom of the feature upwards.

In accordance with further embodiments of the disclosure, a method of forming a gate-all-around device is provided. The method can include forming a source and/or drain region using a method of selectively forming P-doped monocrystalline material as described herein.

In accordance with yet further examples of the disclosure, a field effect transistor device includes one or more of a source region or a drain region formed according to the method described herein.

Further described is a system comprising a reaction chamber, a gas injection system, and a controller configured for causing the system to perform a method according to the present disclosure.

These and other embodiments will become readily apparent to those skilled in the art from the following detailed description of certain embodiments having reference to the attached figures. The invention is not being limited to any particular embodiments disclosed.

BRIEF DESCRIPTION OF THE FIGURES

A more complete understanding of the embodiments of the present disclosure may be derived by referring to the detailed description and claims when considered in connection with the following illustrative figures.

Figure 1:
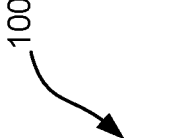
FIG. 1 illustrates a method in accordance with exemplary embodiments of the disclosure.
Figure 1:
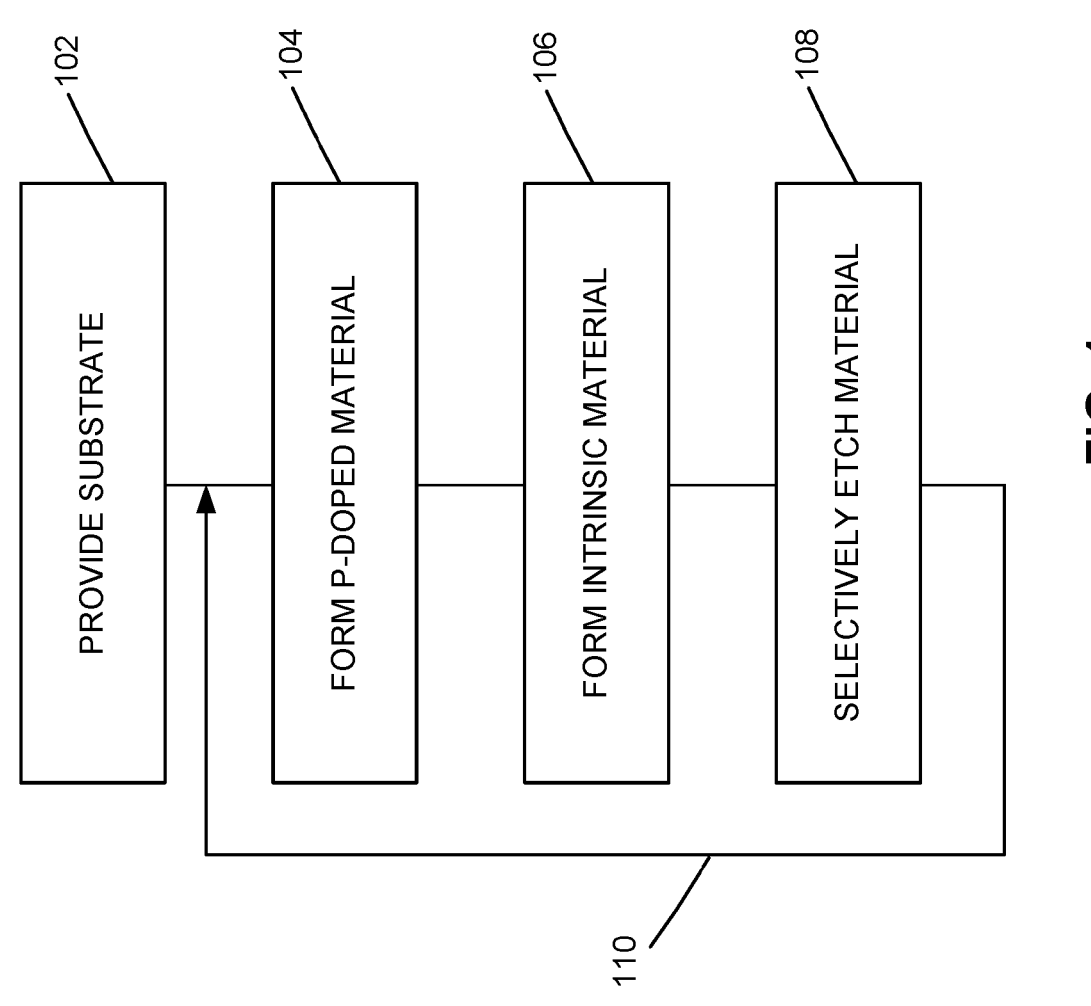

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices, and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments; unless otherwise noted, the exemplary embodiments or components thereof may be combined or may be applied separate from each other.

As set forth in more detail below, various embodiments of the disclosure provide methods for selectively epitaxially forming P-doped monocrystalline material on a surface of a substrate. Exemplary methods can be used to, for example, form source and/or drain regions of semiconductor devices that exhibit relatively high mobility, relatively low resistivity, relatively low contact resistance, and/or that maintain the structure and composition of the deposited layers. For example, the layers can be used as source and/or drain regions in metal oxide field effect transistors (MOSFETS). Exemplary MOSFETS in which these layers can be used include FinFETs and GAA (gate-all-around) FETS.

As used herein, the term "gate-all-around device" may refer to devices that include a conductive material wrapped around a semiconductor channel region. As used herein, the term "gate-all-around device" may also refer to a variety of device architectures, such as nanosheet devices, forksheet devices, vertical FETs, and the like.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a noble gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor.

As used herein, the term "substrate" can refer to any underlying material or materials that can be used to form, or upon which, a device, a circuit, or a film can be formed. As set forth in more detail below, a substrate can include two or more surfaces. In some cases, the surfaces include the same material, but a different crystalline facet or orientation.

As used herein, the term "epitaxial layer" can refer to a single crystalline or monocrystalline layer upon an underlying single crystalline substrate or layer, the two single crystalline layers having the same crystal orientation.

As used herein, the term "chemical vapor deposition" can refer to any process wherein a substrate is exposed to one or more volatile precursors, which react and/or decompose on a substrate surface to produce a desired deposition.

As used herein, the term "film" and/or "layer" can refer to any continuous or non-continuous structures and material, such as material deposited by the methods disclosed herein. For example, a film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. It shall be understood that when a composition, method, device, or the like is said to comprise certain features, it means that it includes those features, and that it does not necessarily exclude the presence of other features, as long as they do not render the claim unworkable. This notwithstanding, the wording "comprises" includes the meaning of "consists of", i.e., the case when the composition, method, device, etc. in question only includes the features, components, and/or steps that are listed, and does not contain any other features, components, steps, etc. In accordance with further aspects, substantially the same can mean within ±5%, ±1%, ±0.5%—e.g., atomic, volume, length, or the like, depending on the context.

In this disclosure, any defined meanings do not necessarily exclude ordinary and customary meanings in some embodiments.

The term "carrier gas" as used herein may refer to a gas that is provided to a reaction chamber together with one or more precursors and/or etchants. For example, a carrier gas may be provided to the reaction chamber together with one or more of the precursors and/or etchants used herein. Exemplary carrier gases include $N_2$, and $H_2$, and noble gases such as He, Ne, Kr, Ar, and Xe.

As opposed to a carrier gas, a purge gas may be provided to a reaction chamber separately, i.e., not together with one or more precursors. This notwithstanding, gases which are commonly used as a carrier gas may also be used as a purge gas, even within the same process. For example, in a cyclic deposition-etch process, $N_2$ used as a carrier gas may be provided together with one or more precursors during deposition pulses, and $N_2$ used as a purge gas may be used to separate deposition and etch pulses. Of course, $N_2$ may be replaced by $H_2$ or another suitable inert gas, such as a noble gas, such as He, Ne, Kr, Ar, and Xe. Hence, it is the manner of how a gas is provided to the reaction chamber that determines whether a gas serves as a purge gas or a carrier gas in a specific context. Thus, as used herein, the term "purge" may refer to a procedure in which an inert or substantially inert gas is provided to a reaction chamber in between two pulses of gases that react with each other. For example, a purge, e.g., using nitrogen gas, may be provided between a precursor pulse and an etchant pulse, thus avoiding or at least minimizing gas phase reactions between the precursor and the etchant. It shall be understood that a purge can be affected either in time or in space, or both. For example, in the case of temporal purges, a purge step can be used, e.g., in the temporal sequence of providing a first precursor to a reaction chamber, providing a purge gas to the reaction chamber, and providing an etchant to the reaction chamber, wherein the substrate on which a layer is deposited does not move. In the case of spatial purges, a purge step can take, for example, the following form: moving a substrate from a first location to which a first precursor is continually supplied, through a purge gas curtain, to a second location to which a second precursor is continually supplied.

As set forth in more detail below, various steps of exemplary methods described herein can be performed in the same reaction chamber or in different reaction chambers of, for example, the same cluster tool.

Turning now to the figures, FIG. 1 illustrates a method 100 of selectively forming P-doped monocrystalline material on a surface of a substrate. Method 100 includes the steps of providing a substrate within a reaction chamber 102 and performing a cyclical deposition process (steps 104-108/loop 110) to selectively form P-doped epitaxial material overlying a first surface, relative to a second surface on the substrate. As illustrated, cyclical deposition process 110 includes one or more deposition cycles, wherein each deposition cycle includes forming P-doped epitaxial material overlying a first surface and forming P-doped epitaxial or non-epitaxial material overlying a second surface (step 104), forming intrinsic epitaxial material overlying the P-doped epitaxial material and forming intrinsic epitaxial or non-epitaxial material overlying the P-doped epitaxial or non-epitaxial material (step 106), and selectively etching the material on the second surface relative to etching the intrinsic epitaxial material and the P-doped epitaxial material on the first surface (step 108).

Figure 2:
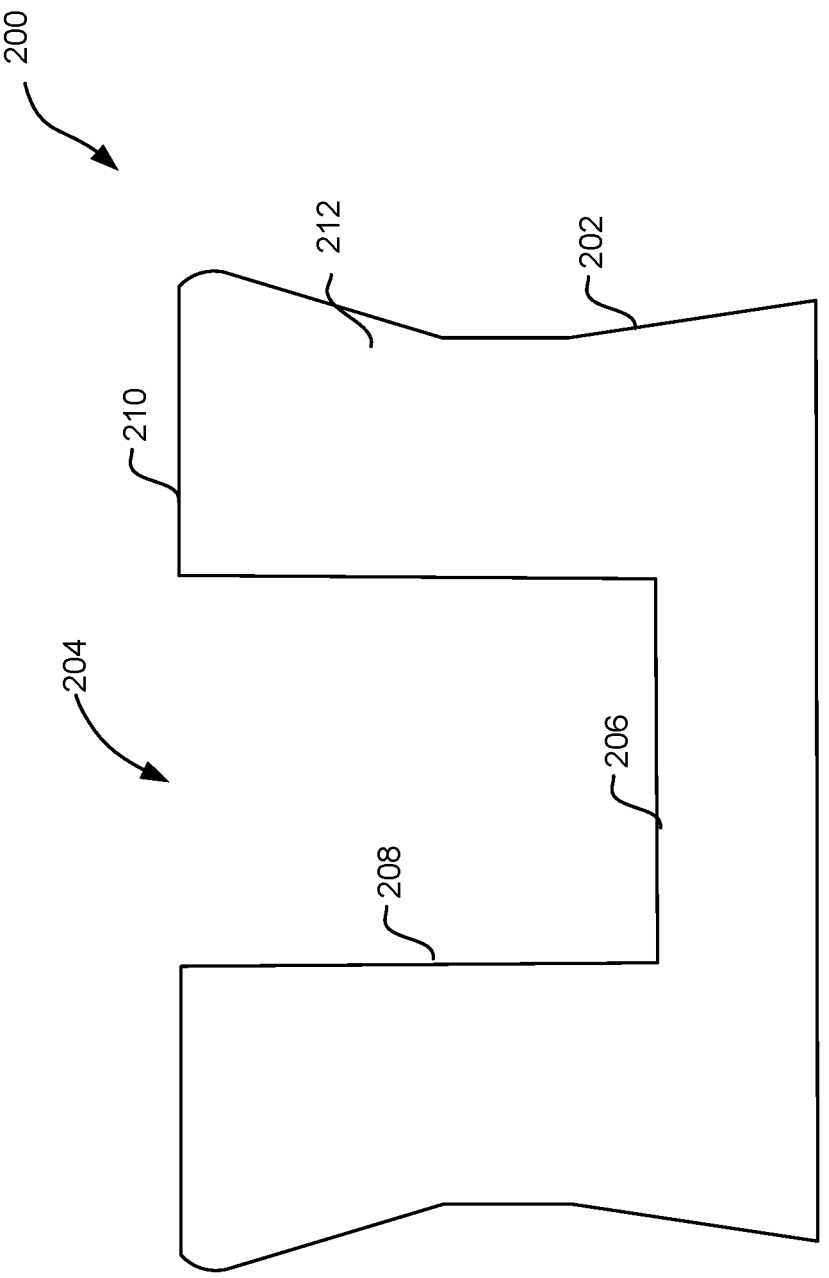
FIGS. 2-6 illustrate structures in accordance with exemplary embodiments of the disclosure.

FIG. 2 illustrates a substrate 200 suitable for use with step 102. Substrate 200 includes bulk material or layer 212 and a feature 204 formed therein (as illustrated) or thereon. In accordance with various examples of the disclosure, bulk material 212 is or includes monocrystalline semiconductor material.

Feature 204 can be in the form of a recess. A recess formed within a substrate or between adjacent protruding structures and any other recess pattern may be referred to as a "gap." That is, a gap may refer to any recess pattern, including a hole/via, trench, region between lines, and the like. A gap can have, in some embodiments, a width of about 20 nm to about 100 nm or about 30 nm to about 50 nm. When a gap has a length that is substantially the same as its width, the gap can be referred to as a hole or a via. Holes or vias typically have a width of about 20 nm to about 100 nm. In some embodiments, an aspect ratio of a feature is greater than 1 or greater than 0.6 or between 0.3 and 1 or between 0.5 and 0.7. The dimensions of the feature may vary depending on process conditions, film composition, intended application, and the like.

In the example illustrated in FIG. 2, substrate 202 includes a bottom comprising a first surface 206 and a sidewall comprising a second surface 208. In accordance with examples of the disclosure, first surface 206 includes a first crystallographic orientation and second surface 208 comprises a second crystallographic orientation different than the first crystallographic orientation. In this context, crystalline orientation can be defined using Miller indices. In other words, a Miller index can be used to define a crystallographic orientation (e.g., by defining a crystalline plane or facet) of the first and/or the second surface. In such cases, differing crystallographic orientations comprise differing (e.g., non-equivalent) Miller indices. For example, in some cases, first surface 206 can include or consist of a Si{100} crystal facet and second surface 208 can comprise or consist of one or more non-Si{100} surfaces, such as a Si{110} crystal facet and a higher order silicon crystal facet that is perpendicularly oriented to a Si{100} crystal facet. Examples of higher order (e.g., silicon) crystal facets that are perpendicular to Si{100} include Si{120}, Si{230}, Si{130}, Si{140}, Si{240}, and Si{340}. In some cases, planes or facets noted herein include the true planes, or true planes±3 degrees, ±2 degrees, or ±1 degree. In some cases, second surface 208 can include dielectric or partially dielectric material.

In accordance with further examples of the disclosure, the first surface 206 and the second surface 208 can be or comprise the same material (e.g., monocrystalline semiconductor material, such as silicon or the like). Substrate 202 can also include a top surface 210, which can comprise the first crystallographic orientation. In some cases, another material can be deposited overlying surface 210 or top surface 210 may include other material.

Returning now to FIG. 1, during step 102, the reaction chamber can be brought to a desired pressure and/or temperature suitable for step 104. By way of examples, a temperature of the reaction chamber or a susceptor therein can be less than 450° C. or between about 400° C. and about 500° C. or between about 440° C. and about 460° C. or between about 440° C. and about 480° C. A pressure within the reaction chamber can be less than 90 torr or less than 60 torr or between about 5 torr and about 60 torr.

Figure 3:
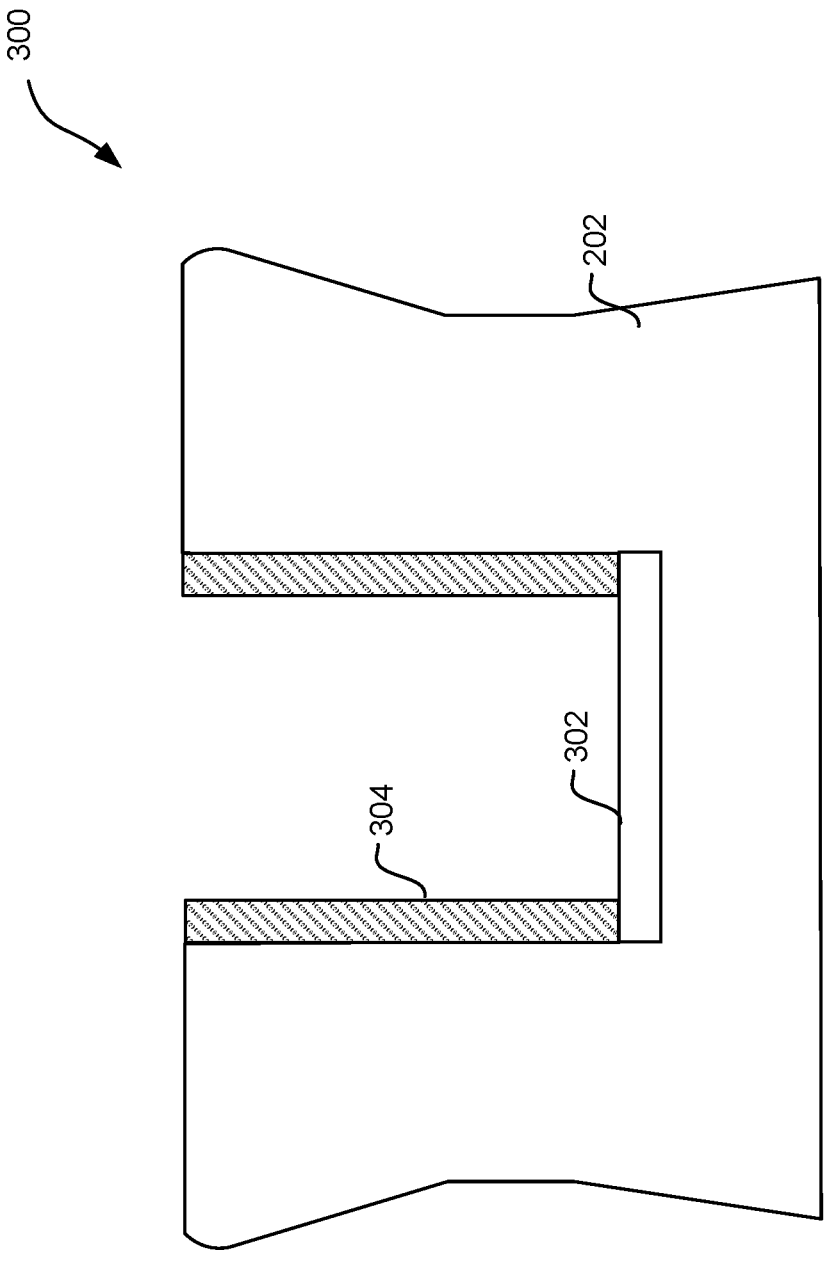

With reference to FIG. 1 and FIG. 3, during step 104, phosphorous-doped (P-doped) epitaxial material 302 is formed overlying first surface 206 and P-doped non-epitaxial or epitaxial material 304 is formed overlying second surface 208. As used herein, non-epitaxial material can include amorphous and/or polycrystalline material. Although deposition on top surface 210 is not illustrated, in some cases, material may be deposited onto top surface 210 and removed—e.g., using a suitable etch process.

Step 104 can be performed by providing a silicon precursor and a phosphorous precursor to the reaction chamber. The silicon precursor can be or include, for example, a silane, such as disilane or trisilane. The phosphorous precursor can be or include, for example, a phosphorous-containing precursor, such as phosphine (PH3). The flowrates of the silicon precursor and the phosphorous precursor can be or include typical flowrates to deposit epitaxial material. In some cases, a concentration of phosphorous in the P-doped epitaxial material is between about 1e20 cm$^{-3}$ and about 3e21 cm$^{-3}$ or between about 5e19 cm$^{-3}$ and about 5e21 cm$^{-3}$.

As illustrated in FIG. 3, during step 104, P-doped epitaxial material 302 forms overlying (e.g., in direct contact with) the first surface 206, and during the same step, because surface 208 has a different crystalline orientation, P-doped epitaxial or non-epitaxial material 304 may form overlying (e.g., in direct contact with) second surface 208. A thickness of P-doped epitaxial material 302 and/or P-doped epitaxial or non-epitaxial material 304 formed during each cycle during step 104 can be about 2 nm to about 10 nm or about 5 nm to about 30 nm.

Figure 4:
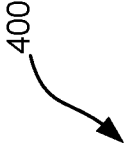
Figure 4:
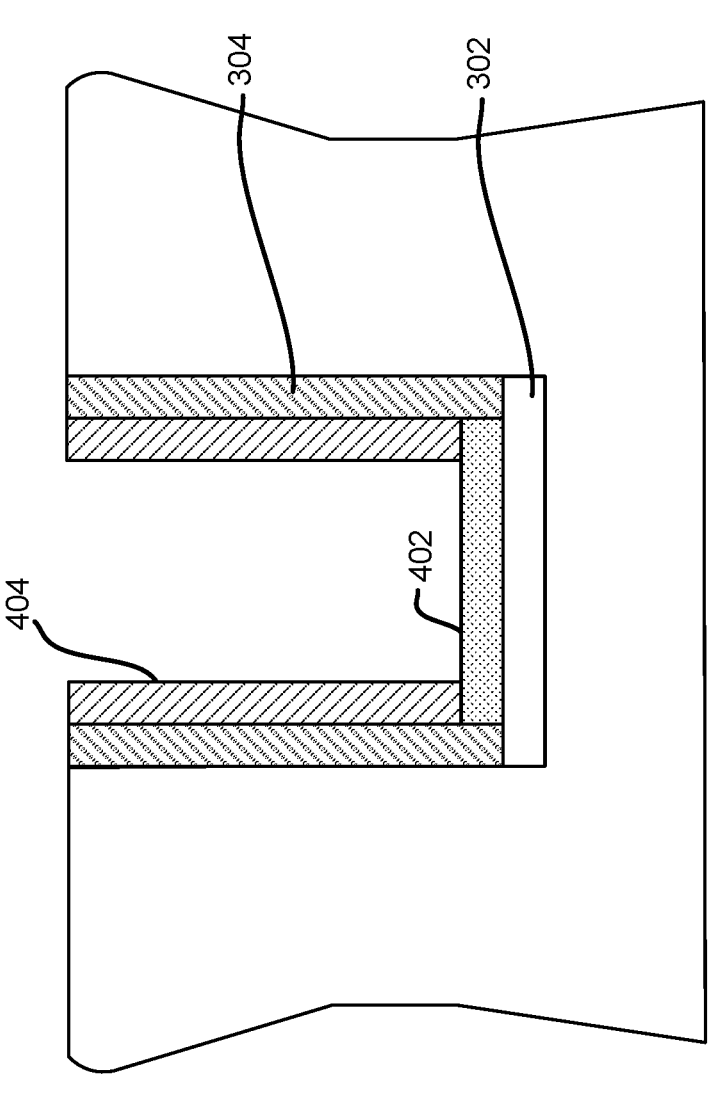

With reference to FIG. 4, during step 106, intrinsic epitaxial material 402 is formed overlying P-doped epitaxial material 302 and intrinsic epitaxial or non-epitaxial material 404 is formed overlying the P-doped epitaxial or non-epitaxial material 304. Intrinsic epitaxial material 402 and intrinsic epitaxial or non-epitaxial material 404 can be formed during a single process step. By way of example, intrinsic epitaxial material 402 and intrinsic epitaxial or non-epitaxial material 404 can be formed by flowing a silicon precursor to the reaction chamber. The silicon precursor can be or include any silicon precursor noted above. In some cases, the silicon precursor used during step 104 and step 106 is the same silicon precursor. A thickness of intrinsic epitaxial material 402 and/or intrinsic epitaxial or non-epitaxial material 404 formed during each cycle during step 106 can be about 2 nm to about 10 nm or about 5 nm to about 15 nm.

Figure 5:
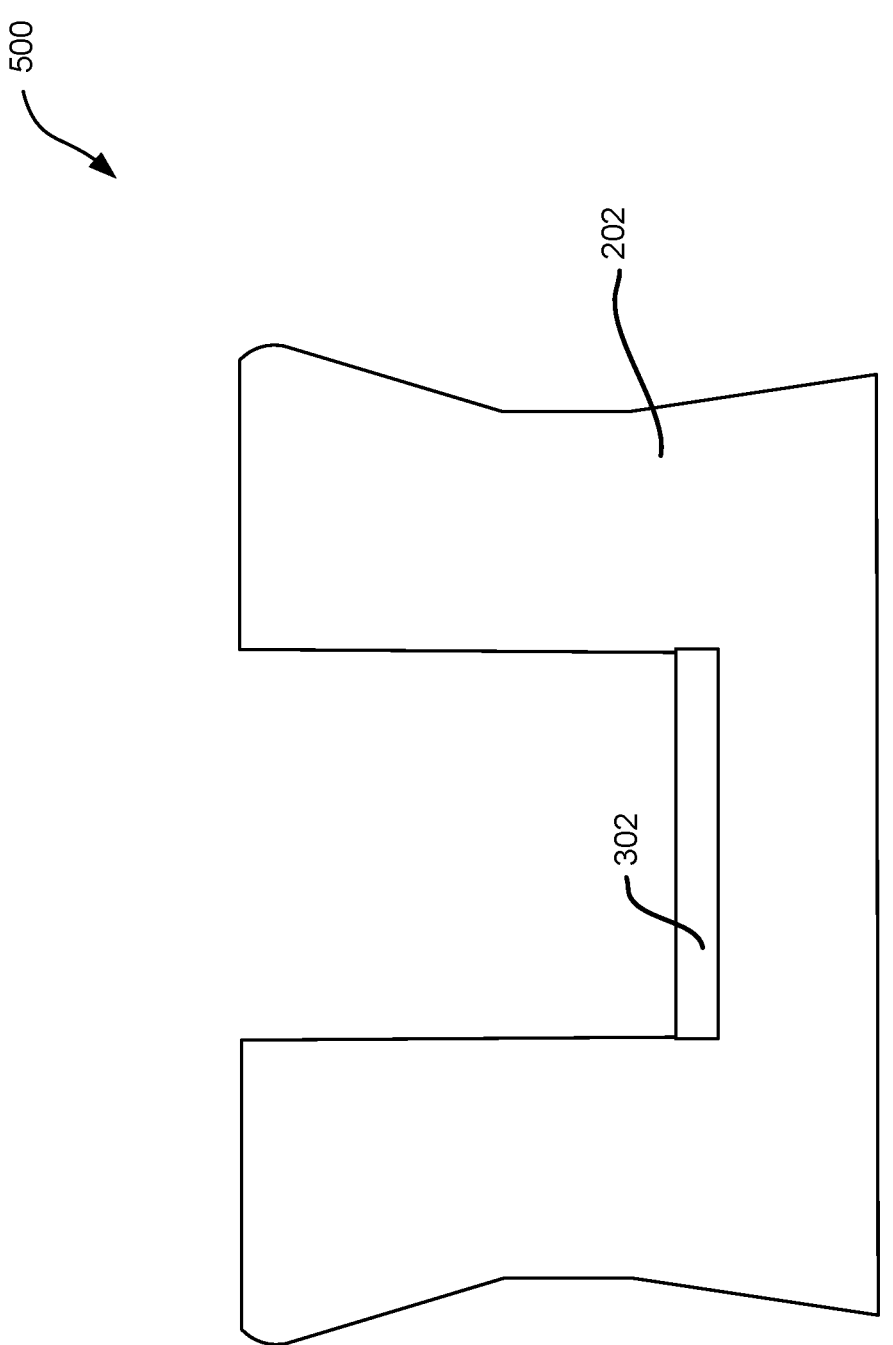

During step 108, intrinsic epitaxial or non-epitaxial material 404 and P-doped epitaxial or non-epitaxial material 304 are selectively etched relative to intrinsic epitaxial material 402 and P-doped epitaxial material 302. In some cases, intrinsic epitaxial material 402, intrinsic epitaxial or non-epitaxial material 404, and P-doped epitaxial or non-epitaxial material 304 overlying the second surface are removed during each deposition cycle 110. The selectivity of the etch can be based on the etch rates of the intrinsic epitaxial or non-epitaxial material or differences of etch rates of intrinsic epitaxial and/or P-doped epitaxial material on two different crystalline facets. FIG. 5 illustrates a structure 500, which is formed after a first deposition cycle after intrinsic epitaxial material 402, intrinsic epitaxial or non-epitaxial material 404, and P-doped epitaxial or non-epitaxial material 304 has been removed.

In accordance with examples of the disclosure, a pressure within the reaction chamber during step 108 can be less than 60 torr or between about 5 torr and about 60 torr. A temperature within the reaction chamber can be the same or similar to the temperature noted above in connection with step 102.

An etchant used during step 108 can include any suitable etchant that selectively etches material overlying the second surface relative to material overlying the first surface. In this way, the intrinsic monocrystalline material overlying the first surface can serve as a cap that protects the P-doped epitaxial material during the etch process. By way of examples, the etchant can be or include a halogen, such as chlorine. By way of particular examples, the etchant can be or include chlorine ($Cl_2$), bromine ($Br_2$), and HBr.

In some cases, step 108 can further include providing a carrier gas, which can act as a diluent. A flowrate ratio of a flowrate of the carrier gas and a flowrate of the etchant is between about 50 and about 200 or between about 30 and about 1300. Such ratios can be used to tune desired selectivity between intrinsic epitaxial material 402 and intrinsic epitaxial or non-epitaxial material 404 and, ultimately, between P-doped epitaxial material 302 and P-doped epitaxial or non-epitaxial material 304.

Figure 6:
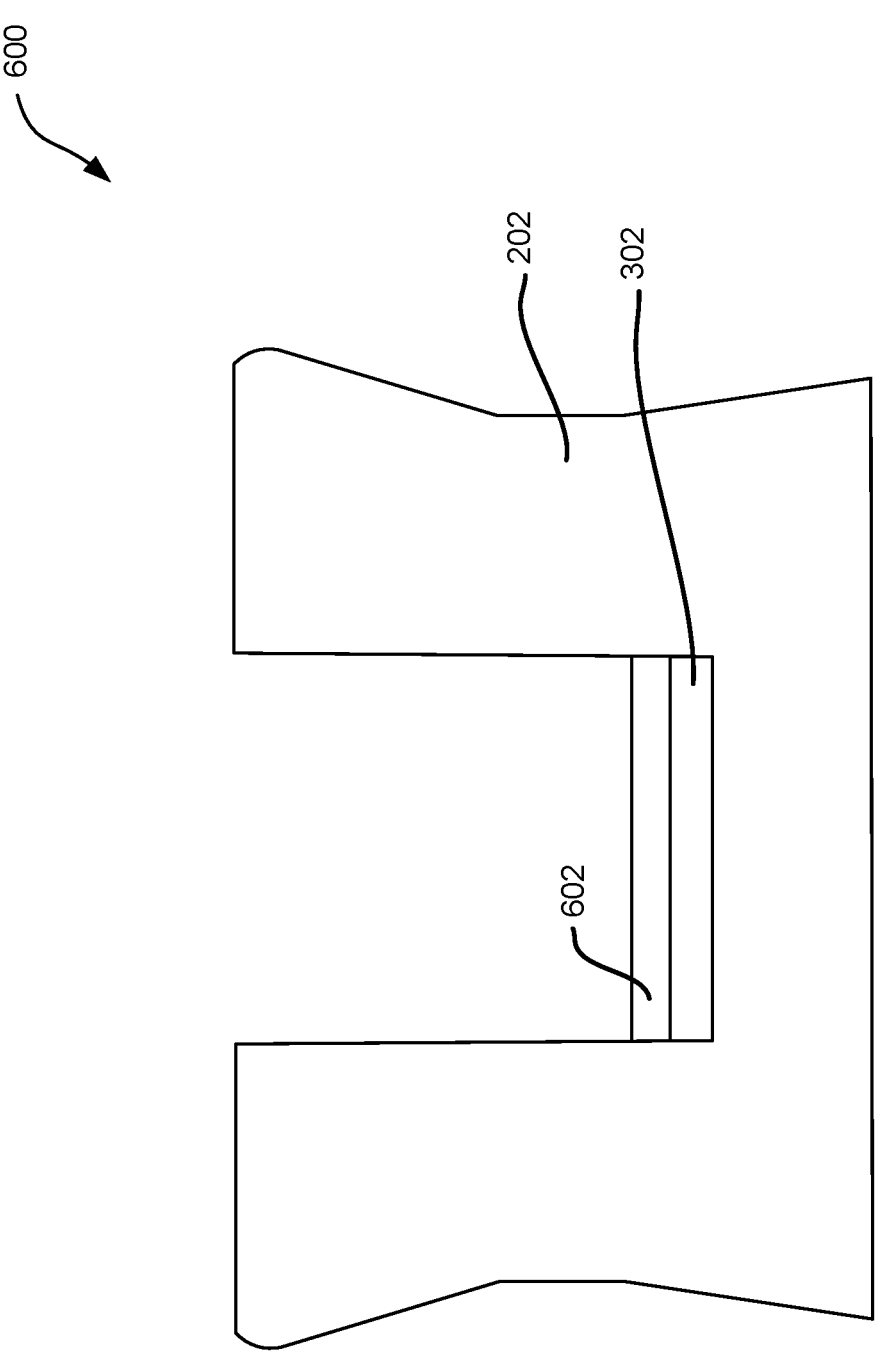

As noted above, step 104 can be repeated (loop 110) a number of times to fill feature 204 from the bottom upwards. FIG. 6 illustrates a structure 600 after a second deposition cycle, in which a second P-doped epitaxial layer 602 is formed overlying P-doped epitaxial material 602. A resistivity of P-doped epitaxial material 302 can be between about 0.22 or about 0.3 or be less than 0.35 mOhm·cm or less than 0.3 mOhm·cm or less than 0.25 mOhm·cm for a thickness of, for example, about 23 nm. Additionally or alternatively, multiple layers of P-doped epitaxial can have a resistivity between about 0.25 and about 0.3 or be less than 0.27 mOhm·cm for a thickness of, for example, about 46 nm.

Filling features with P-doped epitaxial material using a method as described herein can be used for a variety of applications. Such techniques may be particularly well suited for forming three-dimensional structures, such as structures used in the formation of a gate-all-around device. For example, structure 500 can be suitable for use as a source or drain region in a field effect transistor, such as a source or drain region of a gate-all-around field effect transistor.

Figure 7:
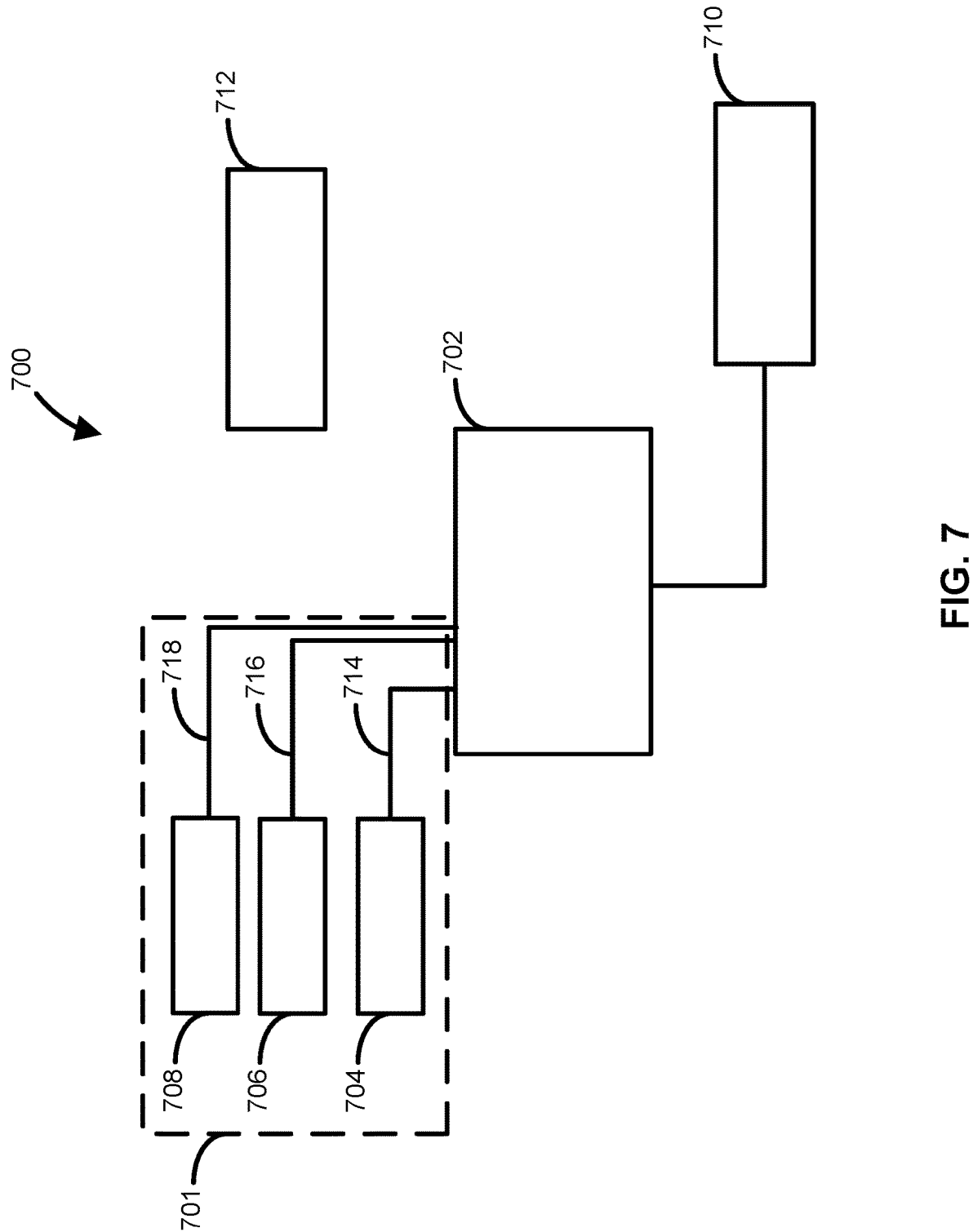
FIG. 7 illustrates a system in accordance with additional exemplary embodiments of the disclosure.

FIG. 7 illustrates a system 700 according to the current disclosure in a schematic manner. System 700 can be used to perform a method as described herein and/or to form a structure or a device, or a portion thereof, as described herein.

In the illustrated example, system 700 includes one or more reaction chambers 702, a precursor injector system 701, a precursor vessel 704, a dopant precursor vessel 706, an etchant vessel 708, an exhaust source 710, and a controller 712. System 700 may comprise one or more additional gas sources (not shown), such as an inert gas source, a carrier gas source and/or a purge gas source. Also, in case materials comprising additional elements are deposited, the deposition assembly may further comprise additional precursor and/or dopant vessels.

Reaction chamber 702 can include any suitable reaction chamber, such as CVD or epitaxial reaction chamber, as described herein.

Precursor vessel 704 can include a vessel and one or more precursors, such as one or more silicon precursors as described herein—alone or mixed with one or more carrier (e.g., inert) gases. Dopant precursor vessel 706 can include a vessel and a dopant precursor, such as a phosphorus precursor as described herein—alone or mixed with one or more carrier gases. Similarly, etchant vessel 708 can include a vessel and an etchant—alone or mixed with a carrier gas. Although illustrated with three source vessels 704, 706, and 708, system 700 can include any suitable number of source vessels. Source vessels 704-708 can be coupled to reaction chamber(s) 702 via lines 714, 716, and 718, which can each include flow controllers, valves, heaters, and the like. In some embodiments, the (e.g., silicon) precursor in precursor vessel 704 and/or dopant precursor in dopant precursor vessel 706 may be heated. In some embodiments, a temperature of at least one of the precursor vessel and the dopant precursor vessel is regulated so that it is below about 35° C., such as between 5° C. and about 35° C.

Exhaust source 710 can include one or more vacuum pumps.

Controller 712 includes electronic circuitry and software to selectively operate valves, manifolds, heaters, pumps and other components included in system 700. Such circuitry and components operate to introduce precursors, etchant, other optional reactants and purge gases from the respective sources. Controller 712 can control timing of gas pulse sequences, temperature of the substrate and/or reaction chamber 702, pressure within reaction chamber 702, and various other operations to provide proper operation of system 700. Controller 712 can include control software to electrically or pneumatically control valves to control flow of precursors, reactants and purge gases into and out of the reaction chamber(s) 702. Controller 712 can include modules, such as a software or hardware component, which perform certain tasks. A module may be configured to reside on the addressable storage medium of the control system and be configured to execute one or more processes. In some cases, system 700 is configured to perform the steps of method 100 within a single reaction chamber 702.

Other configurations of system 700 are possible, including different numbers and kinds of precursor and reactant sources. Further, it will be appreciated that there are many arrangements of valves, conduits, precursor sources, and auxiliary reactant sources that may be used to accomplish the goal of selectively and in a coordinated manner feeding gases into reaction chamber 702. Further, as a schematic representation of a deposition assembly, many components have been omitted for simplicity of illustration, and such components may include, for example, various valves, manifolds, purifiers, heaters, containers, vents, and/or bypasses.

During operation of system 700, substrates, such as semiconductor wafers (not illustrated), are transferred from, e.g., a substrate handling system to reaction chamber 702. Once substrate(s) are transferred to reaction chamber 702, one or more gases from gas sources, such as precursors, other optional reactants, etchant(s), carrier gases, and/or purge gases, are introduced into reaction chamber 702.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of selectively forming P-doped monocrystalline material on a surface of a substrate, the method comprising steps of:

providing a substrate within a reaction chamber, the substrate comprising a bottom surface comprising a first crystallographic orientation and a sidewall surface, which is perpendicular to the bottom surface, comprising a second crystallographic orientation, the bottom surface and the sidewall surface comprising the same material;

performing a cyclical deposition process to selectively form P-doped epitaxial material overlying the bottom surface, relative to the sidewall surface, the cyclical deposition process comprising one or more deposition cycles, each deposition cycle comprising:

forming first P-doped epitaxial material overlying the bottom surface and overlying a first portion of the sidewall surface extending from the bottom surface to a point of the sidewall surface at a height of the first P-doped epitaxial material in a vertical direction and forming second P-doped epitaxial or P-doped non-epitaxial material overlying a second portion of the sidewall surface extending vertically from the point of the sidewall surface at the height of the first P-doped epitaxial material in the vertical direction;

forming first intrinsic epitaxial material overlying an exposed top surface of the first P-doped epitaxial material overlying the bottom surface and forming second intrinsic epitaxial or intrinsic non-epitaxial material overlying the second P-doped epitaxial or P-doped non-epitaxial material overlying the sidewall surface and extending vertically from a top surface of the first intrinsic epitaxial material in the vertical direction; and selectively etching the second intrinsic epitaxial or intrinsic non-epitaxial material and the second P-doped epitaxial or P-doped non-epitaxial material overlying the sidewall surface, relative to the first intrinsic epitaxial material and the first P-doped epitaxial material overlying the bottom surface, wherein the bottom surface consists of a Si{100} crystal facet, and wherein the sidewall surface comprises one or more of a Si{110} crystal facet and a higher order silicon crystal facet that is perpendicularly oriented to a Si{100} crystal facet.

2. The method according to claim 1, wherein the substrate comprises a feature, the feature comprising the bottom surface and the sidewall surface.

3. The method according to claim 2, wherein an aspect ratio of the feature is greater than 1 or greater than 0.6 or between 0.3 and 1 or between 0.5 and 0.7.

4. The method according to claim 2, wherein the feature comprises a gap.

5. The method according to claim 1, wherein a temperature within the reaction chamber during one or more of the steps is less than 450° C.

6. The method according to claim 1, wherein the step of forming the first P-doped epitaxial material overlying the bottom surface comprises providing a silicon precursor comprising a silane.

7. The method according to claim 6, wherein the silicon precursor is selected from one or more of the group consisting of disilane and trisilane.

8. The method according to claim 1, wherein the step of selectively etching comprises providing an etchant comprising chlorine ($Cl_2$).

9. The method according to claim 1, wherein the step of selectively etching further comprises providing a carrier gas and an etchant, wherein a flowrate of the carrier gas and a flowrate of the etchant is between 50 and about 200 or between about 30 and about 1300.

10. The method according to claim 1, wherein a thickness of the first intrinsic epitaxial material overlying the first P-doped epitaxial material is between about 2 nm and about 10 nm.

11. The method according to claim 1, wherein a thickness of the first P-doped epitaxial material is between about 2 nm and about 10 nm.

12. The method according to claim 1, wherein a concentration of phosphorus in the first P-doped epitaxial material is between about 5e19 $cm^{-3}$ and about 5e21 $cm^{-3}$.

13. The method according to claim 1, wherein the second P-doped epitaxial or P-doped non-epitaxial material overlying the sidewall surface is removed during each deposition cycle.

14. The method according to claim 1, wherein the step of forming first intrinsic epitaxial material overlying the first P-doped epitaxial material comprises providing a silicon precursor selected from the group consisting of disilane and trisilane.

15. The method according to claim 14, wherein the silicon precursor provided during the step of forming the first P-doped epitaxial material overlying the bottom surface and the silicon precursor provided during the step of forming the first intrinsic epitaxial material overlying the first P-doped epitaxial material comprises the same silicon precursor.

16. The method according to claim 1, comprising filling a gap with the first P-doped epitaxial material from a bottom of the gap upwards.

17. A method of forming a gate-all-around device comprising the method of claim 1.

18. A system for performing the method of claim 1, wherein each step of the method is performed within the reaction chamber.

19. The method according to claim 1, wherein the first intrinsic epitaxial material serves as a cap that protects the first P-doped epitaxial material overlying the bottom surface during the selectively etching of the second intrinsic epitaxial or intrinsic non-epitaxial material and the second P-doped epitaxial or P-doped non-epitaxial material overlying the sidewall surface.

20. A method of selectively forming P-doped monocrystalline material on a surface of a substrate, the method comprising steps of:

providing a substrate within a reaction chamber, the substrate comprising a bottom surface comprising a first crystallographic orientation and a sidewall surface comprising a second crystallographic orientation, the bottom surface and the sidewall surface comprising the same material;

performing a cyclical deposition process to selectively form P-doped epitaxial material overlying the bottom surface, relative to the sidewall surface, the cyclical deposition process comprising one or more deposition cycles, each deposition cycle comprising:

forming first P-doped epitaxial material overlying the bottom surface and forming second P-doped epitaxial or P-doped non-epitaxial material overlying the sidewall surface;

forming first intrinsic epitaxial material overlying the first P-doped epitaxial material overlying the bottom surface and forming second intrinsic epitaxial or intrinsic non-epitaxial material overlying the second P-doped epitaxial or P-doped non-epitaxial material overlying the sidewall surface above the first intrinsic epitaxial material; and selectively etching the second intrinsic epitaxial or intrinsic non-epitaxial material and the second P-doped epitaxial or P-doped non-epitaxial material overlying the sidewall surface, relative to the first intrinsic epitaxial material and the first P-doped epitaxial material overlying the bottom surface, wherein the first intrinsic epitaxial material serves as a cap that protects the first P-doped epitaxial material overlying the bottom surface during the selectively etching, wherein the bottom surface consists of a Si{100} crystal facet, wherein the sidewall surface comprises one or more of a Si{110} crystal facet and a higher order silicon crystal facet that is perpendicularly oriented to a Si{100} crystal facet, and wherein the first intrinsic epitaxial material serves as a cap that protects the first P-doped epitaxial material overlying the bottom surface during the selectively etching of the second intrinsic epitaxial or intrinsic non-epitaxial material and the second P-doped epitaxial or P-doped non-epitaxial material overlying the sidewall surface.

* * * * *